United States Patent
Ciholas et al.

(10) Patent No.: US 10,764,071 B1
(45) Date of Patent: Sep. 1, 2020

(54) SYSTEM AND METHOD FOR CHAINING POWER AND COMMUNICATIONS TO MULTIPLE NODES

(71) Applicant: CIHOLAS, INC., Newburgh, IN (US)

(72) Inventors: Mike Ciholas, Evansville, IN (US); Justin Bennett, Newburgh, IN (US); Evan Buchanan, Evansville, IN (US)

(*) Notice: Subject to any disclaimer, the term of this patent is extended or adjusted under 35 U.S.C. 154(b) by 0 days.

(21) Appl. No.: 16/851,407

(22) Filed: Apr. 17, 2020

Related U.S. Application Data

(60) Provisional application No. 62/835,293, filed on Apr. 17, 2019.

(51) Int. Cl.
  *H04L 12/10* (2006.01)
  *G01R 19/25* (2006.01)
  *H02M 7/06* (2006.01)

(52) U.S. Cl.
  CPC .......... *H04L 12/10* (2013.01); *G01R 19/2513* (2013.01); *H02M 7/06* (2013.01)

(58) Field of Classification Search
  CPC ....... H04L 12/10; H04L 49/40; H04L 49/405; H04L 25/02; H04L 12/2838; H04L 12/40006–40045; H02M 7/06; G01R 19/2513; H04B 3/54–58; H04B 2203/00–5495; H06F 1/266
  See application file for complete search history.

(56) References Cited

U.S. PATENT DOCUMENTS

| | | | | |
|---|---|---|---|---|
| 6,115,468 A * | 9/2000 | De Nicolo | ............. | H04B 3/548 375/257 |
| 7,145,439 B2 * | 12/2006 | Darshan | ................ | G06F 1/3209 340/12.32 |
| 7,162,377 B2 * | 1/2007 | Amrod | .................... | H04L 43/50 702/60 |
| 7,664,136 B2 * | 2/2010 | Toebes | .................... | G06F 1/266 370/463 |
| 7,681,052 B2 * | 3/2010 | Darshan | ................ | H04L 12/10 713/300 |
| 7,793,124 B2 * | 9/2010 | Landry | ................... | H04L 12/10 713/300 |
| 7,921,307 B2 * | 4/2011 | Karam | .................. | G01R 21/00 370/395.53 |

(Continued)

*Primary Examiner* — James M Perez
(74) *Attorney, Agent, or Firm* — Martin IP Law Group; C. Richard Martin

(57) ABSTRACT

A chainable Power over Ethernet Node (CPEN) is provided according to the invention. The CPEN contains an electronic circuit and control method to pass power, communications, or both power and communications to subsequent chainable nodes or other devices. The invention allows one cable run to serve a plurality of chainable nodes thus greatly reducing the amount of cable required. The invention enables redundant connections in both power and communications to network nodes to prevent failure in case of cable or node fault. The chainable node has 2 or more ports, all of which are interchangeable. Any port can respond to PoE Powered Device (PD) classification and receive power. Any port can act as a Power Supplying Equipment (PSE) to enable power to subsequent nodes. The ports can support standards compliant PoE detection, classification, and operation, and can support non-standard variations.

19 Claims, 7 Drawing Sheets

(56) References Cited

U.S. PATENT DOCUMENTS

| | | | | |
|---|---|---|---|---|
| 8,074,084 B2* | 12/2011 | Karam | H04L 12/10 | 713/300 |
| 8,316,223 B2* | 11/2012 | Karam | H04L 12/10 | 713/1 |
| 8,539,259 B2* | 9/2013 | Darshan | H04L 12/10 | 713/300 |
| 8,635,473 B2* | 1/2014 | Karam | H04L 12/10 | 713/1 |
| 8,667,310 B2* | 3/2014 | Darshan | H04L 12/10 | 713/300 |
| 8,972,757 B2* | 3/2015 | Karam | H04L 12/10 | 713/1 |
| 9,141,160 B2* | 9/2015 | Karam | H04L 12/10 | |
| 9,209,981 B2* | 12/2015 | Heath | H04L 12/10 | |
| 9,709,663 B1* | 7/2017 | Ciholas | G01S 5/0221 | |
| 9,819,501 B2* | 11/2017 | Chen | H04L 12/10 | |
| 9,831,913 B2* | 11/2017 | Tarn | H04B 3/54 | |
| 10,075,302 B2* | 9/2018 | Cao | H04L 12/10 | |
| 10,122,545 B2* | 11/2018 | Radermacher | H05B 47/185 | |
| 10,133,648 B2* | 11/2018 | Hamdi | G06F 11/3062 | |
| 10,401,472 B2* | 9/2019 | Ciholas | G01S 13/878 | |
| 10,567,711 B1* | 2/2020 | Skeoch | H02M 7/06 | |
| 2005/0197094 A1* | 9/2005 | Darshan | H04L 12/10 | 455/402 |
| 2006/0082220 A1* | 4/2006 | Karam | H02J 13/00012 | 307/4 |
| 2006/0092000 A1* | 5/2006 | Karam | H04L 12/44 | 713/300 |
| 2006/0273661 A1* | 12/2006 | Toebes | G06F 1/266 | 307/106 |
| 2007/0041568 A1* | 2/2007 | Ghoshal | H04L 12/10 | 379/324 |
| 2007/0220280 A1* | 9/2007 | Karam | H04L 12/10 | 713/300 |
| 2009/0041004 A1* | 2/2009 | Emmanuel | H04L 1/1671 | 370/352 |
| 2009/0058436 A1* | 3/2009 | Yu | G01R 27/04 | 324/722 |
| 2009/0222678 A1* | 9/2009 | Yu | H04L 12/10 | 713/300 |
| 2009/0249112 A1* | 10/2009 | Diab | H04L 12/10 | 714/2 |
| 2009/0327766 A1* | 12/2009 | Ghoshal | H04L 12/10 | 713/300 |
| 2010/0049998 A1* | 2/2010 | Karam | H04L 12/10 | 713/300 |
| 2010/0274927 A1* | 10/2010 | Bobrek | G06F 1/266 | 709/250 |
| 2011/0102258 A1* | 5/2011 | Underbrink | H04B 1/707 | 342/357.47 |
| 2012/0131357 A1* | 5/2012 | Karam | G06F 1/26 | 713/300 |
| 2012/0313817 A1* | 12/2012 | Underbrink | G01S 19/24 | 342/357.72 |
| 2013/0057056 A1* | 3/2013 | Karam | G06F 1/26 | 307/1 |
| 2014/0108847 A1* | 4/2014 | Karam | G06F 1/26 | 713/340 |
| 2014/0245054 A1* | 8/2014 | Hamdi | H04L 43/08 | 713/340 |
| 2015/0169019 A1* | 6/2015 | Karam | H04L 12/10 | 713/310 |
| 2015/0339206 A1* | 11/2015 | Hamdi | G06F 1/28 | 713/340 |
| 2016/0241029 A1* | 8/2016 | Hodrinsky | H02J 1/14 | |
| 2016/0273722 A1* | 9/2016 | Crenshaw | H05B 47/185 | |
| 2016/0359741 A1* | 12/2016 | Cooper | B61L 15/0072 | |
| 2017/0237580 A1* | 8/2017 | Radermacher | H04L 12/40045 | 307/38 |
| 2017/0338969 A1* | 11/2017 | Paul | G06F 1/26 | |
| 2018/0019884 A1* | 1/2018 | Radermacher | H04L 12/40045 | |
| 2018/0124235 A1* | 5/2018 | Kim | H04L 12/2898 | |
| 2018/0175672 A1* | 6/2018 | Yoden | H02J 50/80 | |
| 2018/0219635 A1* | 8/2018 | Sipes, Jr. | G02B 6/3817 | |
| 2018/0302188 A1* | 10/2018 | Ciholas | H04B 7/022 | |
| 2019/0219664 A1* | 7/2019 | Ciholas | G01S 3/023 | |
| 2019/0386836 A1* | 12/2019 | Gong | H04L 12/10 | |
| 2020/0011909 A1* | 1/2020 | Bickel | G01R 21/133 | |
| 2020/0092118 A1* | 3/2020 | Zhuang | H04L 12/10 | |

* cited by examiner

SYSTEM AND METHOD FOR CHAINING POWER AND COMMUNICATIONS TO MULTIPLE NODES

BACKGROUND OF THE INVENTION

Field of the Invention

The present invention relates to the combination of communications and power delivered over a single cable, commonly known as power over Ethernet (PoE), where node detection and classification is required before power is delivered. More specifically the present invention relates to PoE nodes that can be chained together or connected in series.

Description of the Related Art

Wired networking is a ubiquitous technology that connects computers and electronic devices over a cable so they may exchange information. Electric power is a ubiquitous technology that delivers power to devices over a cable. The combination of the two allows a single cable to deliver both power and communications to a device thus simplifying the installation and maintenance of wired network devices.

Power over Ethernet (PoE) is an example of combining both power and communications over a single cable. A PoE Ethernet switch provides one or more Power Sourcing Equipment (PSE) ports that can provide both power and Ethernet communications on a single cable. A PoE end node has a Powered Device (PD) port that accepts both power and communications on a single cable. Examples of useful PD devices are wireless access points, security cameras, and distributed sensors.

To prevent damage to regular Ethernet devices that are not a PD, and thus cannot accept power over the cable, PSE ports perform a process to detect and classify the attached device to see if it is capable of receiving power. The detection and classification process involves the PSE imposing and measuring various voltages and currents, while the PD responds to these stimuli in specific ways to indicate its ability to accept power and how much power it requires. A non-powered device will fail the detection and classification process and will not be powered.

PoE detection is the first step in determining if a PD is connected. Detection involves imposing a series of either voltages or currents of sufficiently low power that a non-powered device would not be damaged. A PD will present a characteristic resistance on the cable that the PSE can measure. If that resistance is not within the allowed range, then the PSE can determine there is no device on the port or the device is not a PD that will take power.

If the PD passes detection, then a PSE may choose to perform classification. Classification is a means for the PD to indicate the amount of power the PD requires before it receives power. Classification is done with the PSE imposing a voltage within a certain range and the PD passing a current in specified ranges. The amount of current passed qualifies the PD as using power in a number of discrete classes.

Further classification can be done by cycling PSE output voltage between classification range and mark range. The number of classification events and the sequence of currents through the PD indicate to both the PSE and PD how much power the PSE will supply and how much power the PD requires. The use of voltages and currents prior to providing power is called hardware classification.

The PSE has a finite amount of power to apportion to the PDs it powers. Typically, the PSE does not have enough power to provide maximum power on all ports where a PD could be attached. Therefore, each PD is given an allocation of power based on its classification. A PD that classifies at a power level higher than it truly requires causes the PSE to allocate power that will not be available for other nodes. For efficient use of PSE power, PD nodes should classify at the lowest power level they require.

In some PSE and PD implementations, power request and allocation can be controlled after the PD is powered by sending Ethernet packets between the PD and the PSE. This method allows dynamic adjustment of the power requirements. This is called software classification. Not all PSE or PD devices implement this capability.

The IEEE publishes standards for PoE PSE and PD behavior, for example 802.3af, 802.3at, and 802.3bt. Not all devices follow the standards and there are non-standard implementations and variations that exist, for example LTPoE++.

PoE is primarily used in cases where communicating nodes must be distributed over wide areas to perform their function and providing a separate distribution of power is not feasible or cost effective. Examples would be wireless access points, security cameras, and sensor networks. Since each PSE port can only support one PD node, each deployed PD requires a cable that runs from the PSE port to the PD node. Since PD nodes are typically distributed widely, the PSE to PD connections require a lot of cable. As shown in FIG. 1, a standard PoE network according to the prior art includes a PoE Network Switch 10 having a plurality of PSE ports 12a, 12b, 12c, 12d, 12e, each of which may be connected to a powered device (20a, 20b, 20c, 20d, 20e) by an ethernet cable (30a, 30b, 30c, 30d, 30e).

An issue with PoE is that failure of the PSE necessarily means the PD is no longer powered or reachable and thus is inoperative. The PoE system does not provide a means to provide power and communications redundantly to PD nodes.

As shown in FIG. 2, it is also known in the prior art to provide nodes 20a, 20b, 20c, 20d, 20e each of which has a PD port 21 and one or more PSE ports 22. In this way, such a device receives power and communications over the PD port 21 from an upstream PSE 12a or 22 and then passes power and communication to other nodes via the one or more PSE ports 22 to subsequent downstream PD nodes 20. This does allow putting more nodes on one cable run. Such a device, however, does not have interchangeable ports. If the PD and PSE port cables are swapped, the device does not function. Given the cables and ports are visually identical or similar, the probability for mis-plug is significant. Further, the failure of any upstream PSE means the failure of all downstream nodes, so the system lacks redundancy. An additional issue arises from the inability of the PSE to allocate power efficiently because attached PD nodes built this way are unable to anticipate how much power they need. This means such a device either requests more power than it needs, thus consuming the upstream PSE power budget, or it requests too little power leading to inability to power downstream PD nodes.

Accordingly, there is a need for PoE nodes that can be chained together in series such that a single ethernet cable travels from a PSE to a first PD, and then a second PD is connected to the first PD such that it can communicate and receive power from the PSE, and then a third PD is connected to the second PD, and so on, thus drastically reducing the amount of ethernet cable needed to connect multiple PDs to a PSE in a large area. There is a need for nodes in this system that have interchangeable ports such that each port in a node is capable of functioning as either a PD port or PSE port. There is a need for nodes in this system to efficiently allocate power. There is also a need for a PoE network where redundant power is supplied to the PDs from a plurality of PSEs.

SUMMARY OF THE INVENTION

It is therefore an objective of the present invention to provide a practical means to power and communicate with a plurality of nodes on a single cable run without the issues, problems, and limitations of prior solutions.

An object of the invention is to support a number of network nodes on a single cable run. A single PSE port would provide power and communications to a plurality of network nodes. Chainable Power over Ethernet Nodes (CPEN) would greatly reduce the cable requirements in certain use cases.

An object of the invention is to be compatible with existing standards for PoE, standards for other power over networking systems, and to be compatible with various non-standard variations of each.

An object of the invention is to be efficient in power allocation among all devices so that power is used efficiently and effectively.

An object of the invention is that the CPEN have interchangeable cable ports so that there is no designated upstream or downstream port that can be wired incorrectly.

An object of the invention is that the CPEN has a plurality of cable ports that are interchangeable in that each port can serve either as a PSE or as a PD.

An object of the invention is to allow for redundant power and communication such that the failure of any one cable or PSE does not affect system operation. Further, the failure of any one chainable node does not affect any other node.

An object of the invention is that the chainable node circuits and methods be economical and practical to include in commercially viable products.

An object of the invention is that the system provides diagnostics and measurements that can detect, notify, and diagnose faults.

The present invention meets these objects by providing a Chainable Power over Ethernet Node (CPEN) which contains an electronic circuit and control method to pass power, communications, or both power and communications to subsequent chainable nodes or other devices. The invention allows one cable run to serve a plurality of chainable nodes thus greatly reducing the amount of cable required. The invention enables redundant connections in both power and communications to network nodes to prevent failure in case of cable or node fault. The chainable node has 2 or more ports, all of which are interchangeable. Any port can respond to PoE Powered Device (PD) classification and receive power. Any port can act as a Power Supplying Equipment (PSE) to enable power to subsequent nodes. The ports can support standards compliant PoE detection, classification, and operation, and can support non-standard variations.

A chainable node contains two or more identical ports that connect to network cables. The chainable node receives power from any port and optionally provides power out the other ports.

In a typical installation, a PSE network device is installed in a central location and receives power from an external source, typically AC mains power. A cable runs to the first chainable node and is connected to one of the chainable node ports. That port will properly detect and classify as a PD to the PSE and thus the PSE will power the chainable node.

The chainable node, after receiving power, can optionally act as a PSE on its remaining ports to detect, classify, and power subsequent other chaining nodes or other PD devices. The last node on a chain can be a single port typical PD which ends the chain. The last node on the chain can be a chainable node with no other nodes connected which ends the chain.

According to one aspect of the present invention, there is provided a chainable Power over Ethernet node for receiving, transferring and delivering power and communication to other nodes and devices. The node according to this aspect comprises a plurality of connection ports, each port having a connector for receiving a first end of a network cable having a plurality of wire pairs; configuration means for presenting default detect and classification signature to an external power supplying device connected on any of the plurality of connection ports; power receiving means for receiving power from the external power supplying device on any of the plurality of plurality of connection ports; power storage means for storing electrical power sufficient for brief operation without power being supplied from the external power supplying device; disconnect means for electrically disconnecting the node from using power with the aim of causing the external power supplying device to stop providing power; presentation means for presenting to the external power supplying device a selected type and class pattern during hardware reclassification; monitoring means for monitoring the classification process to determine if the node requested power has been granted in full or if the node has been demoted to lesser power; logic processing means for controlling the node behaviors; and an ethernet switch coupled to the connection port for transmitting and receiving communication. Further, each port of the chainable Power over Ethernet node comprises: separation means for separating electrical power and communications on each of the plurality of wire pairs; voltage measuring means for measuring the voltages on each of the plurality of wire pairs; rectifying means for rectifying the electrical power on each of the plurality of wire pairs into positive and negative voltages; imposition and measuring means for imposing a controlled voltage on each of the plurality of wire pairs and for measuring the current through each of the plurality of wire pairs for the purpose of detection and classification of an attached node; sending means for sending out electrical power onto each of the plurality of wire pairs by an electronic switch; and current measuring means for measuring electrical current through the port.

A further feature of the chainable Power over Ethernet node of the invention provides that each port further comprises switching means to bypass the rectifying means to avoid power loss. The node may further comprise a non-volatile memory to record settings and configurations from past operation to aid in optimizing present operation. The node may further comprise external node communication means for exchanging packets containing identity and power information with connected external nodes. The node may further comprise monitoring and reporting means for monitoring the voltages, current and configuration of the node and reporting said voltages, current and configuration information to a central resource. A plurality of switches with intrinsic diodes may be provided which act as the rectifying means for signals entering the node from the port and as the sending means for power exiting the node from the port. The plurality of connection ports may comprise two identical ports.

According to another aspect of the invention, there is provided a system for transferring power and communication in a network comprising a group of chained in series chainable Power over Ethernet nodes. The group further comprises at least a first chainable Power over Ethernet node and a last chainable Power over Ethernet node. Each chainable Power over Ethernet node comprises: a plurality of connection ports, each port having a connector for receiving a first end of a network cable having a plurality of wire pairs; configuration means for presenting default detect and classification signature to an external power supplying device connected on any of said plurality of connection ports; power receiving means for receiving power from the external power supplying device on any of said plurality of plurality of connection ports; power storage means for storing electrical power sufficient for brief operation without power being supplied from the external power supplying device; disconnect means for electrically disconnecting the node from using power with the aim of causing the external power supplying device to stop providing power; presentation means for presenting to the external power supplying device a selected type and class pattern during hardware reclassification; monitoring means for monitoring the classification process to determine if the node requested power has been granted in full or if the node has been demoted to lesser power; logic processing means for controlling the node behaviors; and an ethernet switch coupled to the connection port for transmitting and receiving communication. Each port further comprises: separation means for separating electrical power and communications on each of said plurality of wire pairs; voltage measuring means for measuring the voltages on each of said plurality of wire pairs; rectifying means for rectifying the electrical power on each of said plurality of wire pairs into positive and negative voltages; imposition and measuring means for imposing a controlled voltage on each of said plurality of wire pairs and for measuring the current through each of said plurality of wire pairs for the purpose of detection and classification of the an attached node; sending means for sending out electrical power onto each of said plurality of wire pairs by an electronic switch; and current measuring means for measuring electrical current through the port. The system further comprises: a first power supplying equipment device that provides both communication and electrical power to the system using industry standard Power over Ethernet, said first power supplying equipment device having a port having a connector for receiving a second end of a first network cable having a first end connected to a first one of the plurality of connection ports in the first chainable Power over Ethernet node; and a second network cable having a first end connected to a second one of the plurality of connection ports in the first chainable Power over Ethernet node, and a second end connected to a second one of the plurality of connection ports in the last chainable Power over Ethernet node.

A further feature of the system for transferring power and communication in a network of the invention provides one or more additional Power over Ethernet nodes positioned between said first Power over Ethernet node and said last Power over Ethernet node and connected to other nodes in the group by additional network cables. A second power supplying equipment device may be provided that provides both communication and electrical power to the system using industry standard Power over Ethernet. The second power supplying equipment device may include a port having a connector for receiving a second end of a second network cable having a first end connected to a first one of the plurality of connection ports in one of the additional Power over Ethernet nodes or the last chainable Power over Ethernet node. A third power supplying equipment device may be provided that provides both communication and electrical power to the system using industry standard Power over Ethernet. The third power supplying equipment device may include a port having a connector for receiving a second end of a third network cable having a first end connected to a first one of the plurality of connection ports in one of the additional Power over Ethernet nodes. In this configuration, the first end of the second network cable is connected to said first one of the plurality of connection ports in the last chainable Power over Ethernet node. Alternatively a second power supplying equipment device may be provided that provides both communication and electrical power to the system using industry standard Power over Ethernet. In this configuration, the second power supplying equipment device may include a port having a connector for receiving a second end of a second network cable having a first end connected to a first one of the plurality of connection ports in the last chainable Power over Ethernet node.

According to yet another aspect of the invention, there is provided a method for providing power and communication to one or more chained Power over Ethernet nodes in a network of chained nodes. The method comprises the steps of: performing a detect and classify operation to determine whether a first chained Power over Ethernet node is a powered device, transmitting power from the power source equipment device to the first chainable Power over Ethernet node in an amount corresponding to the request; performing a reclassification of the first chainable Power over Ethernet node to request additional power from the power source equipment device; and transmitting power from the power source equipment device to the first chainable Power over Ethernet node in an amount corresponding to the reclassification request. The step of performing a detect and classify operation further comprises the following steps: generating detect and classify voltages and classify currents at a power source equipment device; transmitting said detect and classify voltages and classify currents over a network cable having a plurality of wire pairs; receiving said detect and classify voltages and classify currents at a connection port of the first chained Power over Ethernet node; separating electrical power and communications on each of said plurality of wire pairs; measuring the voltages on each of said plurality of wire pairs; rectifying the electrical power on each of said plurality of wire pairs into positive and negative voltages; presenting a default detect and classification signature through a powered device circuit in the first chainable Power over Ethernet node; transmitting a request from the connection port to the power source equipment device for power sufficient to operate the first chainable Power over Ethernet node based on the default detect and classify signature.

A further feature of the method for providing power and communication to one or more chained Power over Ethernet nodes in a network of chained nodes of the invention provides that the step of performing a detect and classify operation is triggered by connection of the first chainable Power over Ethernet node to the power source equipment device. The step of performing a detect and classify operation may be triggered by internal powering of the first chainable Power over Ethernet node that is connected to the power source equipment device. Further, the reclassification step may further comprise the steps of: transmitting through network communications a power level requirement report from the first chainable Power over Ethernet node to the power source equipment device; determining if the power level requirement report exceeds the amount of power currently provided to the first chainable Power over Ethernet node; if additional power is needed, transmitting additional power from the power source equipment device to the first chainable Power over Ethernet node; wherein the power source equipment device and the first chainable Power over Ethernet node exchange network packets to renegotiate the power requirements of the first chainable Power over Ethernet node. The reclassification step may also further comprise the steps of: disabling a regulator of the chainable Power over Ethernet node causing a virtual disconnect of the connection port of the first chained Power over Ethernet node with the power source equipment device using a PD disconnect module; removing power supplied by the power source equipment device to the first chained Power over Ethernet node, wherein a Power over Ethernet processor in the chainable Power over Ethernet node continues to operate from power supplied by a power storage module in the chainable Power over Ethernet node; configuring a PD detect and classification module in the chained Power over Ethernet node to a new desired classification; and transmitting power from the power source equipment device to the first chainable Power over Ethernet node in an amount corresponding to the new desired classification.

The method may further comprise the steps of: performing a detect and classify operation to determine whether an additional downstream chained Power over Ethernet node is a powered device; transmitting power from the first chainable Power over Ethernet node to the additional downstream chainable Power over Ethernet node in an amount corresponding to the request; performing a reclassification of the second downstream chainable Power over Ethernet node to request additional power from the first chainable Power over Ethernet node; and transmitting power from the first chainable Power over Ethernet node to the additional chainable Power over Ethernet node in an amount corresponding to the reclassification request. The detect and classify step may further comprise the following steps: generating detect and classify voltages and classify currents at the first chained Power over Ethernet node; transmitting said detect and classify voltages and classify currents over a network cable having a plurality of wire pairs; receiving said detect and classify voltages and classify currents at a connection port of the additional downstream chained Power over Ethernet node; separating electrical power and communications on each of said plurality of wire pairs; measuring the voltages on each of said plurality of wire pairs; rectifying the electrical power on each of said plurality of wire pairs into positive and negative voltages; presenting a default detect and classification signature through a powered device circuit in the additional chainable Power over Ethernet node; transmitting a request from the connection port of the additional chainable Power over Ethernet node to the first chainable Power over Ethernet node for power sufficient to operate the additional chainable Power over Ethernet node based on the default detect and classify signature; The steps outlined above may be repeated for further additional downstream chainable Power over Ethernet nodes.

These and other objects, features and advantages of the present invention will become apparent from a review of the following drawings and detailed descriptions of the preferred embodiments of the invention.

BRIEF DESCRIPTION OF THE DRAWINGS

The present invention can best be understood in connection with the accompanying drawings. It is noted that the invention is not limited to the precise embodiments shown in the drawings, in which.

DETAILED DESCRIPTION OF THE INVENTION

Figure 1:
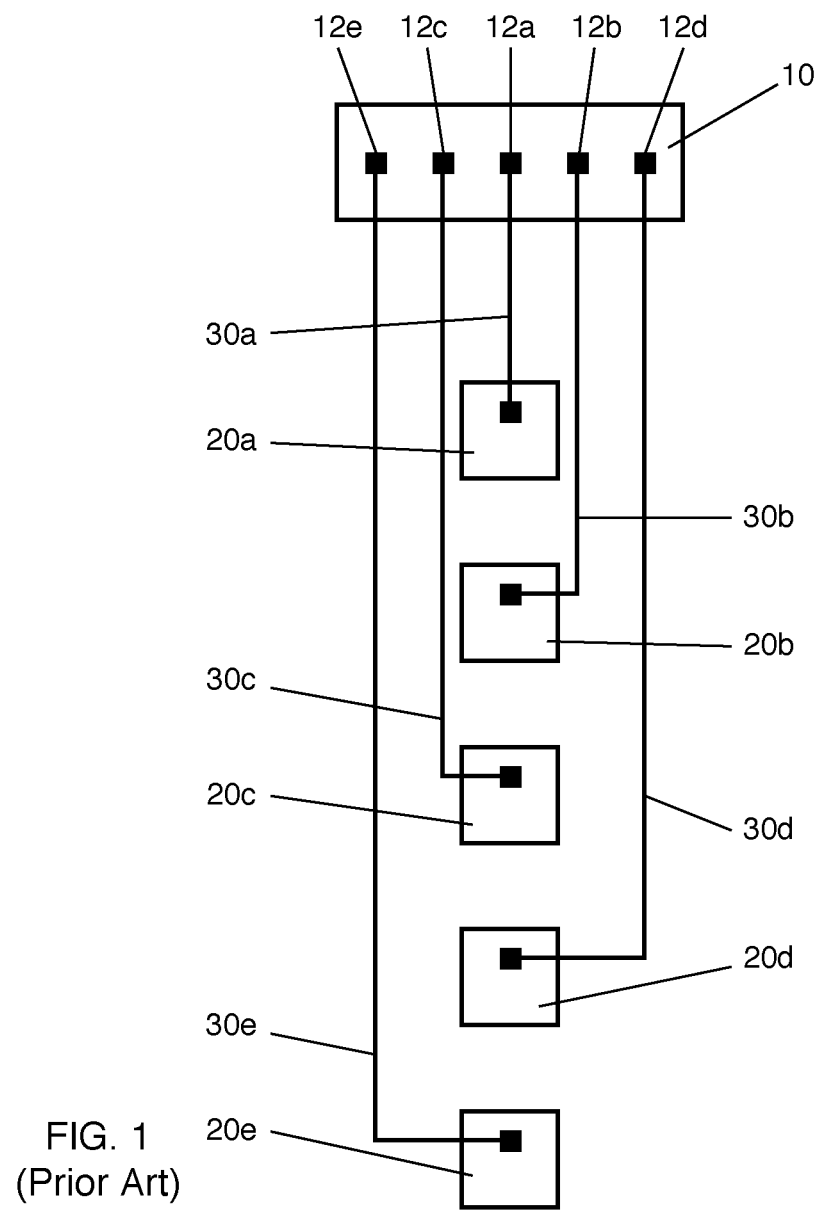
FIG. 1 is a block diagram of a prior art PoE network having a plurality of nodes linked to a corresponding plurality of PSEs on a network switch by a corresponding plurality of ethernet cables.
Figure 2:
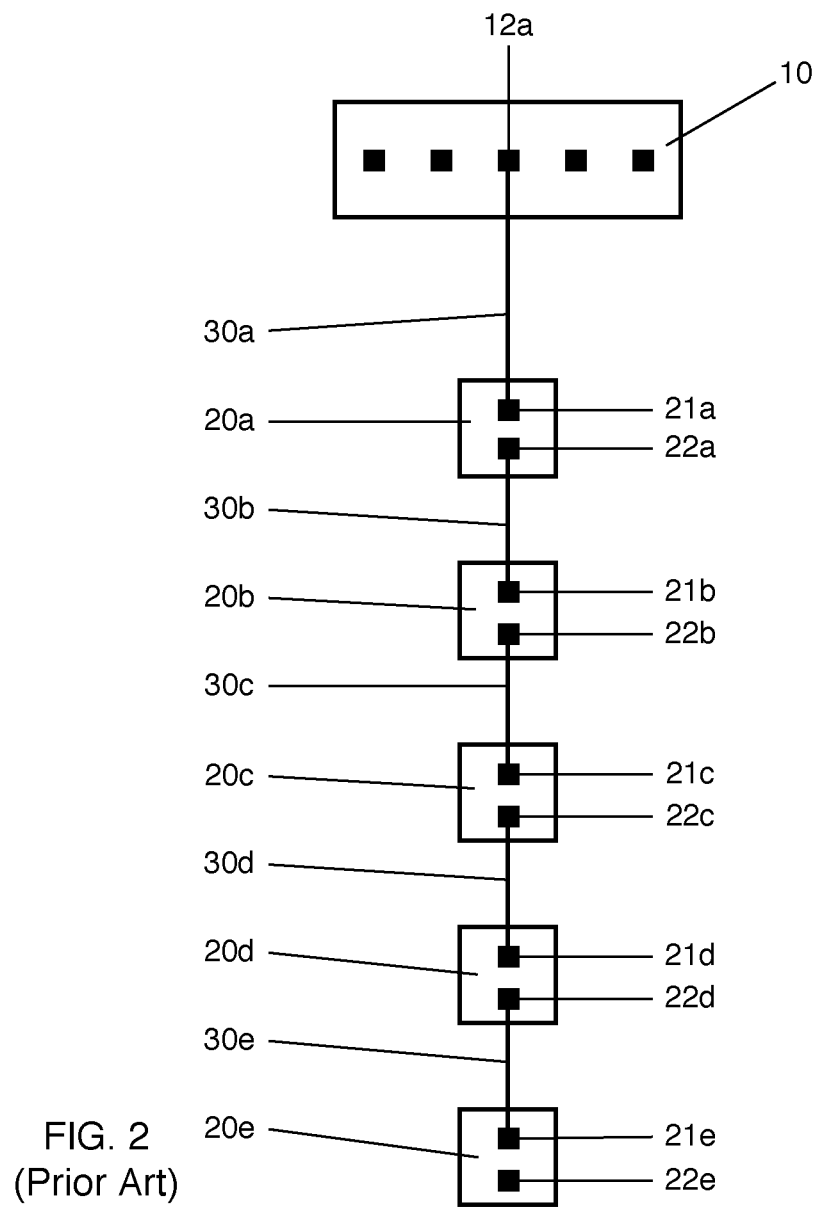
FIG. 2 is a block diagram of a prior art PoE network having a plurality of nodes where a PD port in each node is connected to a PSE port in an upstream node by an ethernet cable.

For purposes of promoting and understanding of the principles of the invention, reference will now be made to the embodiments illustrated in the drawings and specific language will be used to describe the same. It will nevertheless be understood that no limitation of the scope of the invention is thereby intended. The invention includes any alterations and further modifications in the illustrated devices and described methods and further applications of the principles of the invention that would normally occur to one skilled in the art to which the invention relates.

Figure 3A:
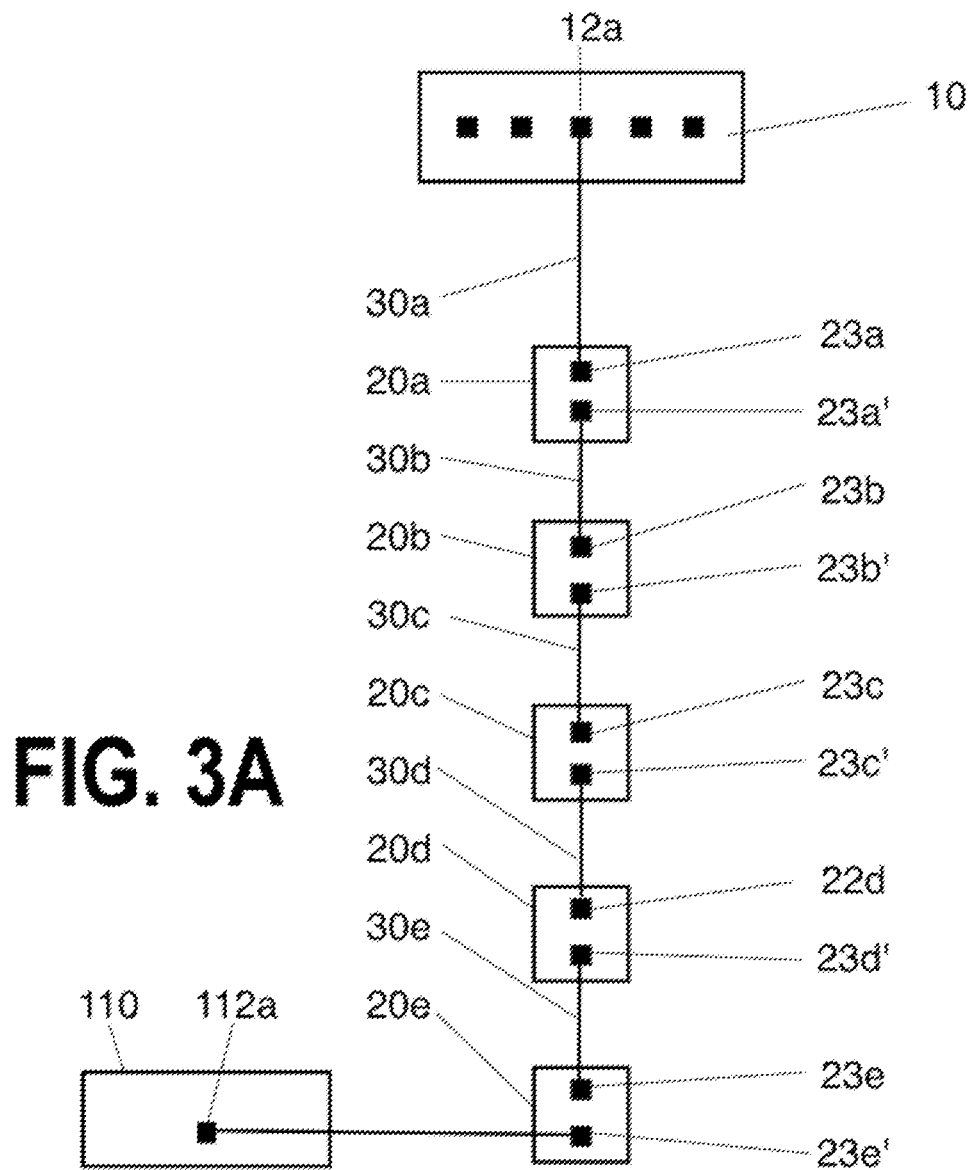
FIG. 3A is a block diagram of a PoE network according to one presently preferred embodiment of the invention.

As best shown in FIG. 3A, one presently preferred embodiment of the invention comprises a system for chaining power and communications to multiple nodes having a first PoE Power Sourcing Equipment (PSE) 10 having at least one PSE port 12a which is connected to a first PD/PSE port 23a in a first CPEN 20a by a length of ethernet cable 30a. A second PD/PSE port 23a' of the first CPEN 20a is then chained to a first PD/PSE port 23b in a second CPEN 20b by a second length of ethernet cable 30b. In like fashion, a second PD/PSE port 23b' of the second CPEN 20b is then chained to a first PD/PSE port 23c in a third CPEN 20c by a third length of ethernet cable 30c, a second PD/PSE port 23c' of the third CPEN 20c is then chained to a first PD/PSE port 23d in a fourth CPEN 20d by a fourth length of ethernet cable 30d, and a second PD/PSE port 23d' of the fourth CPEN 20d is then chained to a first PD/PSE port 23e in a fifth CPEN 20e by a fifth length of ethernet cable 30e. While FIG. 3 shows five (5) CPEN nodes 20a, 20b, 20c, 20d, 20e chained together, the invention contemplates any combination of two or more nodes linked in this fashion. A second PoE PSE 110 having at least one PSE port 112a may be connected to the second PD/PSE port 23e' in the last CPEN 20e in the chain.

The PD/PSE ports in each node (i.e. port 23a and port 23a' of CPEN 20a) are essentially mirror images of one another, function in the same manner, and can serve as either a PD node or PSE node as will be explained further below with regard to FIG. 4 and FIG. 5. Power can be supplied to the CPEN nodes 20*a*, 20*b*, 20*c*, 20*d*, 20*e* by either the first PoE PSE 10, the second PoE PSE 110, or both, as will also be explained below. Thus, a redundant power source is available to all nodes. For example, If the first PoE PSE 10 is somehow disabled and incapable of providing power to the nodes (i.e. due to a fire or power failure in the electrical closet in which the switch is located), the nodes can be powered by the second PoE PSE 110. Similarly, if there is a break in the ethernet cable 30*b* connecting the first CPEN 20*a* to the second CPEN 20*b*, the system can adjust so that the first CPEN 20*a* is powered by the first PoE PSE 10 and the second, third, fourth and fifth nodes 20*b*, 20*c*, 20*d*, 20*e* are powered by the second PoE PSE 110. The way in which this is done will be described below with reference to FIG. 5 and FIG. 6.

Figure 3B:
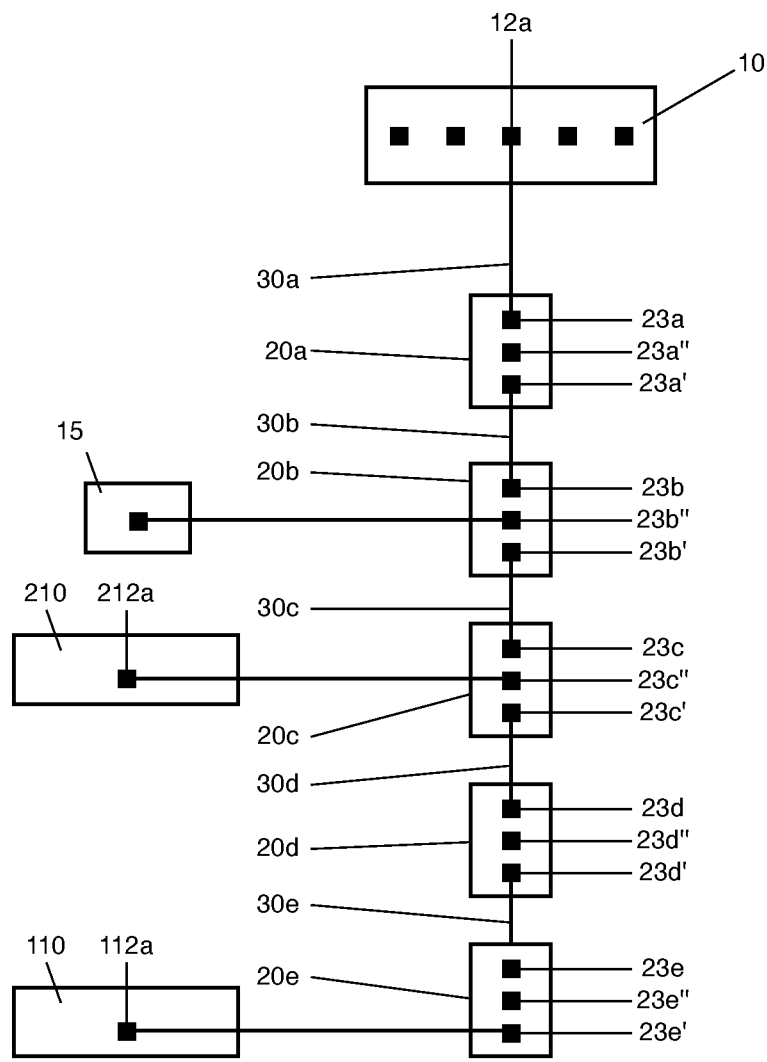
FIG. 3B is a block diagram of a PoE network according to an alternative preferred embodiment of the invention.

As shown in FIG. 3B, according to an alternative implementation of the method of the invention having a first PoE PSE 10 having at least one PSE port 12*a* which is connected to a first PD/PSE port 23*a* in a first CPEN 20*a* by a length of ethernet cable 30*a*. A second PD/PSE port 23*a*' of the first CPEN 20*a* is then chained to a first PD/PSE port 23*b* in a second CPEN 20*b* by a second length of ethernet cable 30*b*. In like fashion, a second PD/PSE port 23*b*' of the second CPEN 20*b* is then chained to a first PD/PSE port 23*c* in a third CPEN 20*c* by a third length of ethernet cable 30*c*, a second PD/PSE port 23*c*' of the third CPEN 20*c* is then chained to a first PD/PSE port 23*d* in a fourth CPEN 20*d* by a fourth length of ethernet cable 30*d*, and a second PD/PSE port 23*d*' of the fourth CPEN 20*d* is then chained to a first PD/PSE port 23*e* in a fifth CPEN 20*e* by a fifth length of ethernet cable 30*e*. While FIG. 3B shows five (5) nodes 20*a*, 20*b*, 20*c*, 20*d*, 20*e* chained together, the invention contemplates any combination of two or more nodes linked in this fashion. A second PoE PSE 110 having at least one PSE port 112*a* may be connected to a second PD/PSE port 23*e*' in the last node 20*e* in the chain. A third PoE PSE 210 having at least one PSE port 212*a* may be connected to a third PD/PSE port 23*c*" in CPEN node 20*c*, or alternatively any other CPEN node 20*a*, 20*b*, 20*d*, 20*e* in the chain. While FIG. 3B shows three (3) PoE PSE 10, 110, 212, the invention contemplates any combination of one or more nodes linked in this fashion.

The PD/PSE ports in each node (i.e. port 23*a*, 23*a*', and 23*a*" of node 20*a*) are essentially mirror images of one another, function in the same manner, and can serve as either a PD node or PSE node as will be explained further below with regard to FIG. 4 and FIG. 5. Power can be supplied to the nodes 20*a*, 20*b*, 20*c*, 20*d*, 20*e* by either the first PoE PSE 10, the second PoE PSE 110, the third PoE PSE 212, or any of a plurality of PoE PSE devices, as will also be explained below. Thus, a redundant power source is available to all nodes.

The PD/PSE ports in each node (i.e. port 23*a*, 23*a*', and 23*a*" of CPEN 20*a*) act as PoE standards compliant Power Sourcing Equipment. Any standard compliant PD 15, or a plurality of standard compliant PD 15, can be plugged into the PD/PSE port 23*b*" and receive power and communication. Further, while FIG. 3B shows three (3) PD/PSE ports (i.e. ports 23*a*, 23*a*', 23*a*" in a CPEN node 20*a*), the invention contemplates any combination of two or more PD/PSE ports in a given CPEN node.

Figure 4:
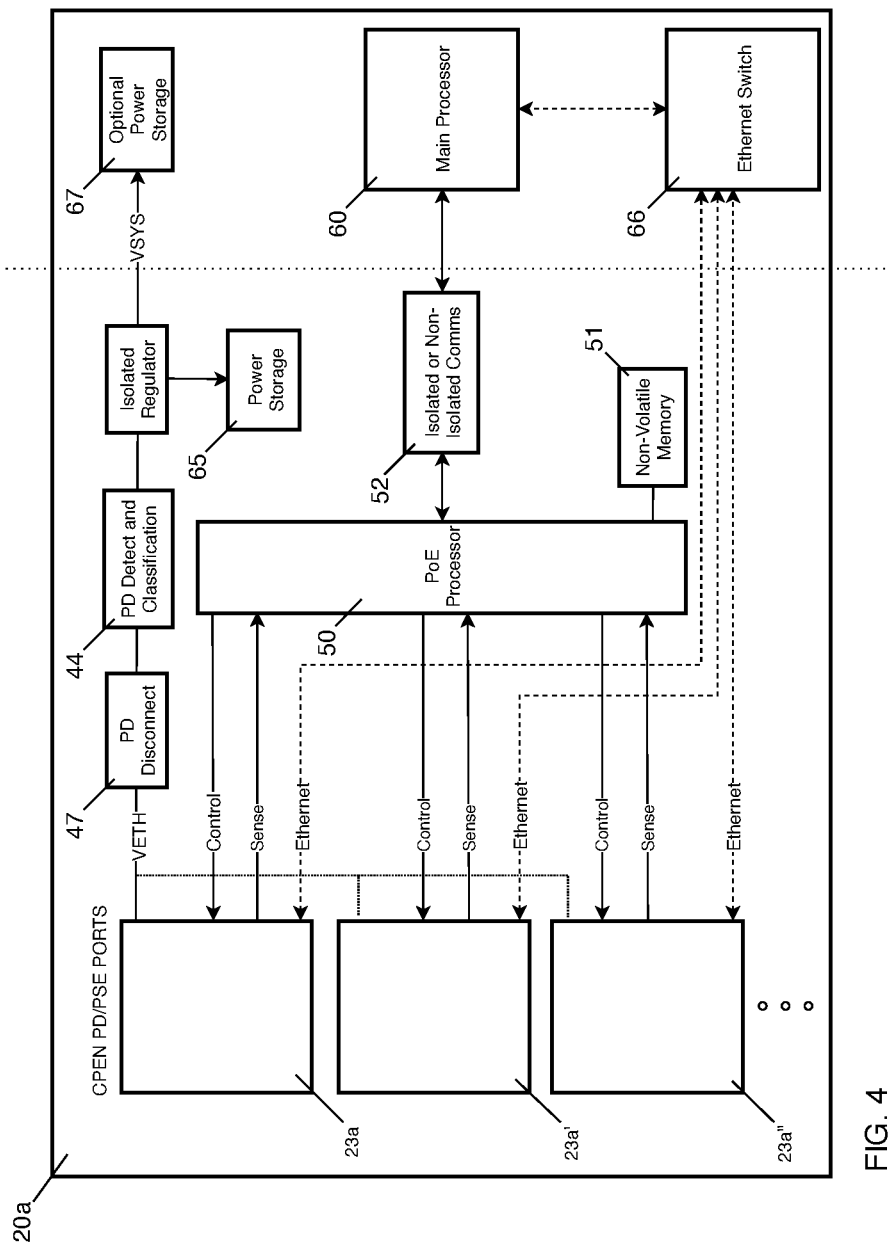
FIG. 4 is a block diagram of a Chainable Power over Ethernet Node (CPEN) of the PoE network according to a presently preferred embodiment of the invention.
Figure 5:
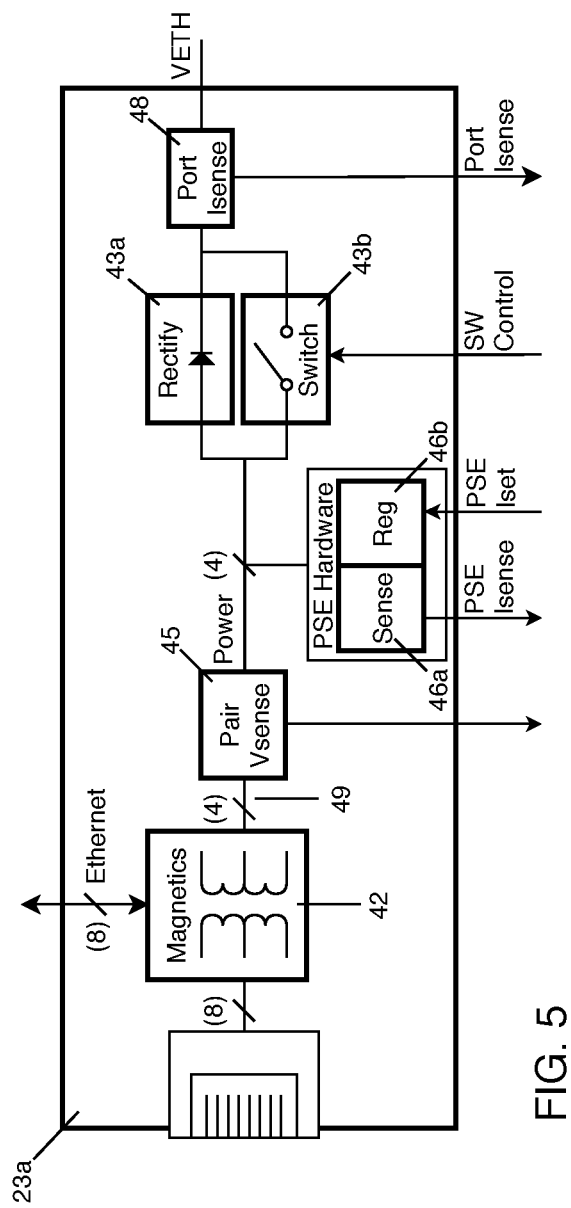
FIG. 5 is a block diagram of a PD/PSE port of a CPEN as shown in FIG. 4 according to one presently preferred embodiment of the invention.

As best shown in FIG. 4, a Chainable Power over Ethernet Node (CPEN) 20*a* according to the present invention includes a plurality of PD/PSE ports 23*a*, 23*a*', 23*a*". As previously mentioned, the ports are functionally identical and any port can be connected to a PoE PSE or another CPEN. Thus, the first PD/PSE port 23*a* can function as a PD port while the remaining plurality of PD/PSE ports 23*a*' and 23*a*" function as a PSE port, or vice-versa. However, for simplicity sake, in the functional description of the invention herein, the system is described with the first PD/PSE port 23*a* acting as a PD port receiving power from the PoE PSE 10 and with the second PD/PSE port 23*a*' acting as a PSE port for supplying power to downstream chainable nodes 20*b*, 20*c*, 20*d*, 20*e*. Additionally a CPEN 20*a* contains a means to act as a PD detect and classification module 44 that allows the CPEN 20*a* to act as a PD during initial operation, a PoE processor 50 to control the node behaviors, a PD disconnect 47 for disconnecting the CPEN 20*a* from using power, a means to provide electrical power storage module 65 that allows the CPEN to store sufficient electrical power for brief operation of the PoE processor during power outages and/or disconnects, an ethernet switch 66, an optional non-volatile memory 51 to record settings and configurations, an optional main processing unit 60, an optional power storage 67 to power main processor 60 and switch 66 during power outage, an optional isolated or non-isolated means of communication 52 between the PoE processor 50 and main processor 60.

CPEN Power Up and Classification:

A CPEN 20*a* with no power waits for any of its PD/PSE ports 23*a* to become active and supply power. As shown best in FIG. 5, power and communication to the CPEN 20*a* come in through the cable 30*a* and are split into separate power and communication paths by the magnetics 42. The process of powering CPEN 20*a* starts with an external PSE 10 performing a detect and classify operation. When the CPEN 20*a* is first plugged into the PSE 10, or the PSE 10 is first powered, the PSE 10 will perform a detect and classify process to determine if a PoE PD device is attached. The first port 23*a* of the CPEN 20*a* receives the detect and classify voltages and classify currents. The applied voltage or current is rectified at rectification module 43*a* and flows through a current sense circuit 48 to measure current flow in or out of the port. The rectify and power switch 43*a*, 43*b* rectifies the voltages such that, regardless of which pair pins power and ground are applied, the PD circuit 44 will receive the voltage difference properly. The PD circuit 44 responds by presenting a default detect and classification signature. The CPEN 20*a* will usually request a classification power level that is sufficient only for the CPEN 20*a* itself. This power level may be inadequate to power subsequent devices that may be attached to the remaining PD/PSE 23*a*' ports The PD Circuit 44 may be implemented using commercially available integrated circuits that incorporate an IEEE standards PoE Powered Device (PD) interface. Many devices are known in the art and can be used to perform detection and classification.

Once detection and classification are done, the external PSE 10 powers up the CPEN 20*a* if adequate power is available. At this point the CPEN 20*a* is powered and functional and stores a small amount of electrical energy in power storage module 65 for use in hardware reclassification described below and shown in FIG. 6. The CPEN 20*a* also measures the voltages using voltage sense circuit 45 on the pairs from all of the PD/PSE port 23*a* and 23*a*' to determine which port provided power. The PoE processor 50 has control over the switch 43*b* and rectification circuit 43*a*. To optimize power delivery, the PoE processor 50 will turn on the appropriate switch 43*b* to eliminate the diode voltage loss from rectifier 43*a*.

Additionally, the PoE processor 50 performs checks and measurements on the system to verify proper operation has occurred. These measurements can be provided to the main processor 60 through isolated or non-isolated communication circuit 70, which can then be further sent by network packets to any other network device.

Reclassification:

The CPEN 20*a* is expected to provide power to other CPEN 20*b* or PD devices and the default classification power level described above is generally insufficient. In order to receive more power from the PSE 10, the CPEN 20*a* must reclassify to a higher power class with sufficient power to power the chain.

Reclassification can be accomplished by using either the software method or the hardware method. Typically, only the border CPEN (either 20*a* or 20*e* from FIG. 3) will utilize the hardware reclassification method. Downstream nodes (20*b*, 20*c*, 20*d*) will primarily use the software method for reclassification.

Using the software method, the CPEN 20*a* first reports the power level it requires by itself when it first powers on. If more power is required, some PSE 10 implement network layer communications to request more power. In these cases, the CPEN 20*a* and PSE 10 exchange network packets to renegotiate the power requirements of the CPEN 20*a* plus the power that the attached CPEN 20*b* is requesting.

Figure 6:
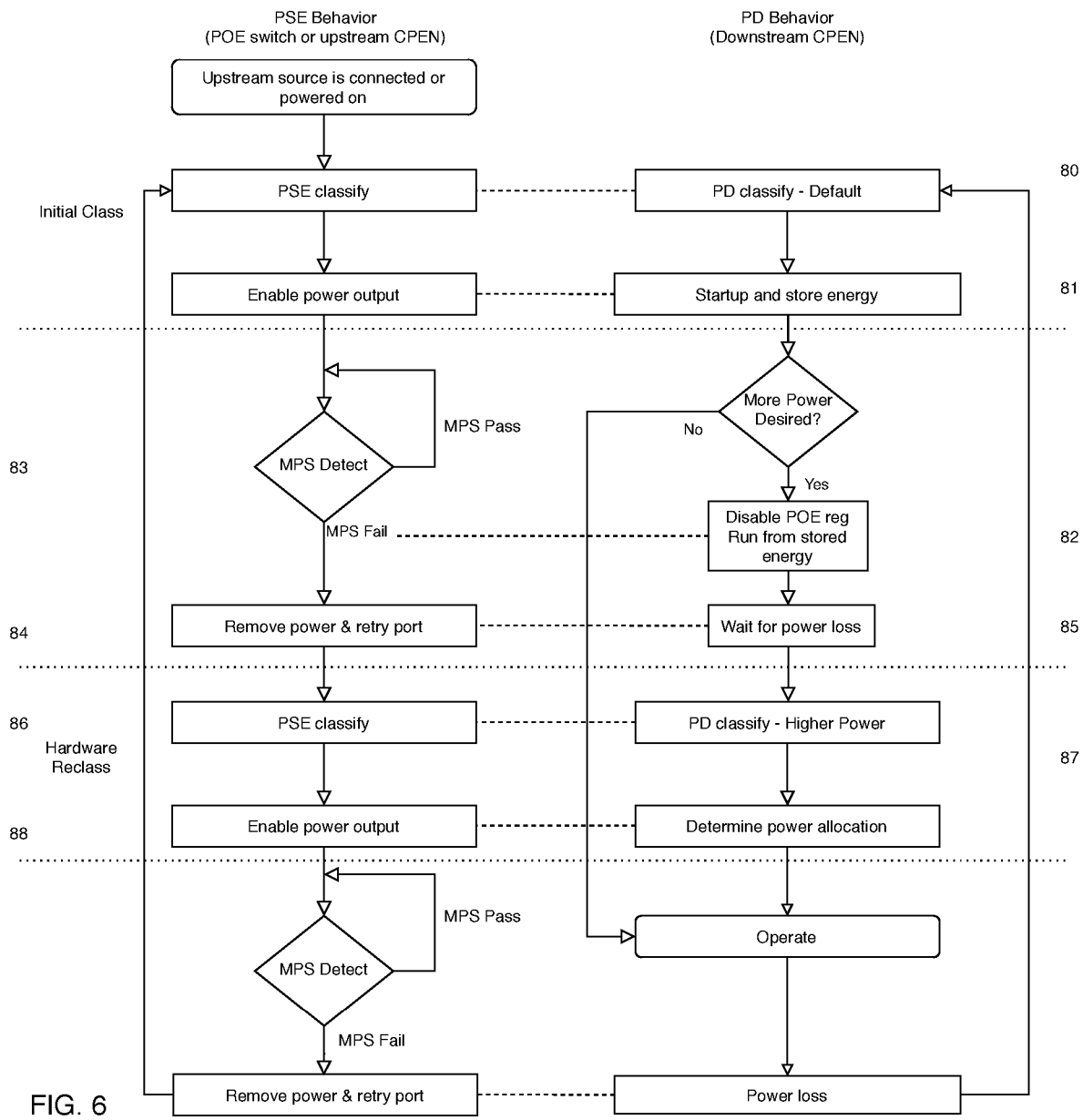
FIG. 6 is a flow diagram showing a typical PSE to PD reclassification according to a presently preferred embodiment of the invention.

Some PSE do not have the ability to renegotiate power allocation over the network and rely solely on the hardware classification method to determine power allocation. When the CPEN 20*a* needs a new power classification, it performs a hardware reclassification as best shown in FIG. 6. Prior to reclassification the CPEN 20*a* has classified 80 as described above and is powered and storing energy 81. In order to force a reclassification 86, the chainable node 20*a* must disable the PoE regulator 82 by causing a virtual disconnect of the first port 23*a* of the CPEN 20*a* with the PSE 10 using PD disconnect 47. This causes the Minimum Power Signature (MPS) 83 to fail, forcing the PSE 10 to remove power and attempt to reclassify 86 the port 23*a*. Once the PSE 10 detects the lack of power draw, it will turn off the power 84 on the cable 30*a*. During this time the PoE processor 50 in the CPEN 20*a* will operate for a period of several seconds 85 on stored energy from the power storage module 65. The PoE processor 50 will observe the PSE disconnect through the loss of voltage on the pair at voltage sense module 45 and will configure the PD detect and classification module 44 to achieve the new desired classification 87.

Once classification is complete with the new desired power level, the PSE 10 again supplies power 88 to the CPEN 20*a* with the new higher power limit.

PSE Operation:

Once powered and operating, the CPEN 20*a* can optionally act as a PSE on the second port 23*a*' to detect, classify, and power another CPEN 20*b* that is connected to the second port 23*a*' by cable 30*b*. This process is repeated down the chain of linked nodes—from the second CPEN 20*b* to the third CPEN 20*c*, the third CPEN 20*c* to the fourth CPEN 20*d*, the fourth CPEN 20*d* to the fifth CPEN 20*e* and so on to the last node in the chain.

The PSE detect and classify process involves the CPEN 20*a* imposing voltages using the detect and classify regulator 46*b* on the cable pairs 49 of port 23*a*'. If the voltages and currents match the expected values, and there is enough power allocated as described below, the port is provided power by turning on the electrical switches 43*b*. Thus the attached CPEN node 20*b* is provided power.

The CPEN 20*a* PoE processor 50 monitors the current flow through current sense module 48 of the PD/PSE port 23*a*'. If the PD/PSE port 23*a*' current usage falls below the MPS 83, then the power switch 43*b* is turned off removing power from the PD/PSE port 23*a*', and the detect and classify process repeats. If the current exceeds a minimum threshold during the detection process, this indicates a non-PoE device is attached to the port 23*a*' and power should not be applied.

Classification of downstream node by upstream node:

The PoE Processor 50 then controls the classify regulator 46*b* to apply appropriate classification event voltages. The attached PD 20*b* will apply the correct classification current for its power class. That current can be measured at PSE sense module 46*a*. By standard, certain current levels map to certain power requirements of the attached device 20*b*. The classification process may involve applying multiple classification voltages separated by mark voltages. As per the PoE standard, the PoE processor 50 can control the number of classification pulses that are produced. Once the classification is fully done, the PoE processor 50 knows the power requirements of the attached device 20*b*.

Power Allocation:

With the power requirements of the attached CPEN device 20*b* known through classification, the PoE processor 50 of CPEN 20*a* can determine if there is enough power remaining to power up the attached CPEN device 20*b*. The PoE processor 50 does this by subtracting the power allocated to the CPEN 20*a* by the PSE 10 from the power the CPEN 20*a* is actually using. If there is enough power left to power the attached node 20*b*, then the node 20*b* is powered. If a node 20*b* requests more power than the CPEN 20*a* can deliver, the node 20*b* is not powered up. This keeps a network operational and under the allocated power limits.

Quick Start:

To accelerate the bring up of a chain of nodes, the first CPEN 20*a* in a chain, the border CPEN, can remember the power requirements that were needed the last time the chain was powered. It can immediately reclassify at that power level on first power up and avoid a series of reclassifications as each node in the chain powers up. If the assumed configuration of the chain is different from what was stored, the border node 20*a* can do the reclassification process described to establish what is needed in the new configuration. The configuration information can be stored in the non-volatile memory 51 of the POE processor 50 to expedite the process of incremental reclassification.

As an alternative to incremental reclassification, the border node 20*a* can request the most power the PSE 10 can provide. The chainable nodes 20*a*, 20*b*, 20*c*, 20*d*, 20*e* then power up each node until the power allocation is exhausted or the chain ends. If there is significantly more power allocated than needed, the border node 20*a* can software or hardware reclassify to the appropriate power level.

Redundant Operation:

A collection of CPENs (20*a*, 20*b*, 20*c*, 20*d*, 20*e*) wired together, as shown in FIG. 3A and FIG. 3B, can have more than one PSE supplying current. In this scenario, power and communication redundancy can be provided such that the failure of any one cable will not disable any node, and the failure of any one node will not affect any other nodes.

As shown in FIG. 3A, a collection of CPENs (20*a*, 20*b*, 20*c*, 20*d*, 20*e*) having two ports each can be connected together in a chain, and a redundant system would have a first PSE device 10 at a first end of the chain connected to port 23*a* of CPEN 20*a* and a second PSE device 110 at a second end of the chain connected to port 23*e*' of CPEN 20*e*.

The first and last CPENs 20*a*, 20*e* in the chain would be the border nodes. Similarly, as shown in FIG. 3B, a collection of CPENs (20*a*, 20*b*, 20*c*, 20*d*, 20*e*) having three ports each can be connected together in a chain, with side chains linking additional PSEs 210, PDs 15, or even additional CPENs or chains of CPENS (not shown). In such a configuration, a redundant system would have a first PSE device 10 at a first end of the chain connected to port 23*a* of CPEN 20*a*, a second PSE device 110 at a second end of the chain connected to port 23*e'* of CPEN 20*e*, and a third PSE device 210 connected to port 23*c"* of CPEN 20*c*. In this configuration, CPENs 20*a*, 20*c*, and 20*e* in the chain would be the border nodes. While FIG. 3A and FIG. 3B show CPENs with two and three ports each, respectively, the invention contemplates additional ports in each CPEN which would allow for additional PD devices, CPENs, and/or PSEs to be connected in a virtual spider-web like network of connected devices.

Operation of the redundant chain is similar to the single PSE case when there is only one PSE powered. In that case, all the nodes will be powered from one PSE. The last CPEN 20*e* will not detect a valid PD while it is connected to a second PSE 110 that is un-powered. The CPEN 20*e* will not try to power the second PSE 110.

When the PSE 110 is powered, it will try to detect devices on its PSE port 112*a*. If the PSE 10 is currently providing adequate power to all nodes in the chain, the last border CPEN 20*e* will not be detected since it is already powered by the first PSE 10 through the chain. The PoE processor 50 of the border CPEN 20*e* can monitor the pair voltages 45 and sense the PSE 110 is trying to detect and classify. The border CPEN 20*e* can perform a disconnect from CPEN 20*d* on PD/PSE port 23*e* and do a hardware reclassification with the PSE 110 on PD/PSE port 23*e'* at a power level suitable to power the entire chain. Border CPEN 20*e* can obtain the full chain power requirement by communicating with border CPEN 20*a*. If reclassification is successful, the border CPEN 20*e* remains powered by the PSE 110.

Through network communication, each CPEN 20*a*, 20*b*, 20*c*, 20*d*, 20*e* determines which PSE 10, 110 or 210 is fewer network hops away. The PoE process 50 in each CPEN 20*a*, 20*b*, 20*c*, 20*d*, 20*e* configures its power switch 43*b* to receive power in the direction of fewest hops to a PSE 10, 110 or 210. Thus, in the configuration shown in FIG. 3A, roughly half the chainable nodes are powered by the first PSE 10, and half by the second PSE 110. Splitting of nodes reduces power loss in the cable. Even though each PSE is powering only half the nodes, the allocation to each PSE is sufficient to power the entire chain from one PSE alone.

If a PSE fails, the chainable nodes powered from that PSE lose their power. The PoE processor 50 of each CPEN 20*a*, 20*b*, 20*c*, 20*d*, 20*e* that loses power detects the power loss and reconfigures the power switch 43*b* to use power from the other PSE. There is sufficient energy stored 65 to power the PoE processor 50 during this change. If the main processor 60 and associated circuits have a power storage module 67, they can remain in operation during this power reconfiguration. If a cable fails between any two nodes, the same response is triggered. The nodes that lose power switch the power switch 43*b* arrangement to receive power from the other port. The switch over is preloaded and computed so the power loss is short.

If the main processor 60 and node Ethernet switch 66 lose power, connectivity will be lost briefly while the power is reconfigured. To avoid the connectivity loss and provide for completely uninterrupted handling of a PSE or cable fault, the main processor 60 and Ethernet switch 66 have to operate off power storage 67 during the power change.

Additionally, the Ethernet network can be configured with two directions of packet travel; one to the PSE 10, and one to the PSE 110. Thus every CPEN 20*a*, 20*b*, 20*c*, 20*d*, 20*e* has two directions to send and receive packets. For full network redundancy, every CPEN 20*a*, 20*b*, 20*c*, 20*d*, 20*e* can be configured to send or receive two packets, one through the PSE 10 and one through the PSE 110. This can be accomplished using VLANs and appropriate configuration of the CPEN 20*a*, 20*b*, 20*c*, 20*d*, 20*e* ethernet switches 66.

Communications and Monitoring:

The CPEN 20*a* can optionally contain a communications link 52 between the PoE processor 50 and the main processor 60. System information regarding voltage readings at the voltage sense module 45, current readings at the current sense module 48, switch state at switch 43, and general PD/PSE state and logic information can be shared across the communications link 52. The main processor 60 can optionally share this information via the ethernet switch 66 to the connected network using standard protocols such as Link Layer Datagram Protocol (LLDP), or non-standard packet structures. LLDP is a means for ethernet connected nodes to communicate identity and power status. LLDP can be useful to manage power at a finer level than is available through hardware classification. An optional feature of the CPEN 20*a* is to use LLDP power management to avoid hardware reclassification.

The communication link 52 between the main processor 60 and the PoE processor 50 may also be used as a means for the main processor 60 to configure PD/PSE state information of the CPEN 20*a* such as power allocation, or to force reclassification.

This detailed description, and particularly the specific details of the exemplary embodiment disclosed, is given primarily for clearness of understanding and no unnecessary limitations are to be understood therefrom, for modifications will become evident to those skilled in the art upon reading this disclosure and may be made without departing from the spirit or scope of the claimed invention.

We claim:

1. A chainable Power over Ethernet node for receiving, transferring and delivering power and communication to other nodes and devices comprising:
   a. a plurality of connection ports, each port having a connector for receiving a first end of a network cable having a plurality of wire pairs;
   b. presentation means for presenting default detect and classification signature to an external power supplying device connected on any of said plurality of connection ports;
   c. power receiving means for receiving power from the external power supplying device on any of said plurality of plurality of connection ports;
   d. power storage means for storing electrical power sufficient for brief operation without power being supplied from the external power supplying device;
   e. disconnect means for electrically disconnecting the node from using power with the aim of causing the external power supplying device to stop providing power;
   f. configuration means for presenting to the external power supplying device a selected type and class pattern during hardware reclassification;

g. monitoring means for monitoring the classification process to determine if the node requested power has been granted in full or if the node has been demoted to lesser power;
h. logic processing means for controlling the node behaviors; and
i. an ethernet switch coupled to the connection port for transmitting and receiving communication;
j. wherein each port further comprises:
   i. separation means for separating electrical power and communications on each of said plurality of wire pairs;
   ii. voltage measuring means for measuring the voltages on each of said plurality of wire pairs;
   iii. rectifying means for rectifying the electrical power on each of said plurality of wire pairs into positive and negative voltages;
   iv. imposition and measuring means for imposing a controlled voltage on each of said plurality of wire pairs and for measuring the current through each of said plurality of wire pairs for the purpose of detection and classification of an attached node;
   v. sending means for sending out electrical power onto each of said plurality of wire pairs by an electronic switch; and
   vi. current measuring means for measuring electrical current through the port.

2. The chainable Power over Ethernet node according to claim 1, wherein each port further comprises switching means to bypass the rectifying means to avoid power loss.

3. The chainable Power over Ethernet node according to claim 1, wherein the node further comprises a non-volatile memory to record settings and configurations from past operation to aid in optimizing present operation.

4. The chainable Power over Ethernet node according to claim 1, wherein the node further comprises external node communication means for exchanging packets containing identity and power information with connected external nodes.

5. The chainable Power over Ethernet node according to claim 1, wherein the node further comprises monitoring and reporting means for monitoring the voltages, current and configuration of the node and reporting said voltages, current and configuration information to a central resource.

6. The chainable Power over Ethernet node according to claim 1, wherein a plurality of switches with intrinsic diodes act as the rectifying means for signals entering the node from the port and as the sending means for power exiting the node from the port.

7. The chainable Power over Ethernet node according to claim 1, wherein said plurality of connection ports comprises two identical ports.

8. A system for transferring power and communication in a network comprising:
a. a group of chained in series chainable Power over Ethernet nodes, said group comprising at least a first chainable Power over Ethernet node and a last chainable Power over Ethernet node, and wherein each chainable Power over Ethernet node comprises:
   i. a plurality of connection ports, each port having a connector for receiving a first end of a network cable having a plurality of wire pairs;
   ii. presentation means for presenting default detect and classification signature to an external power supplying device connected on any of said plurality of connection ports;
   iii. power receiving means for receiving power from the external power supplying device on any of said plurality of plurality of connection ports;
   iv. power storage means for storing electrical power sufficient for brief operation without power being supplied from the external power supplying device;
   v. disconnect means for electrically disconnecting the node from using power with the aim of causing the external power supplying device to stop providing power;
   vi. configuration means for presenting to the external power supplying device a selected type and class pattern during hardware reclassification;
   vii. monitoring means for monitoring the classification process to determine if the node requested power has been granted in full or if the node has been demoted to lesser power;
   viii. logic processing means for controlling the node behaviors; and
   ix. an ethernet switch coupled to the connection port for transmitting and receiving communication;
   x. wherein each port further comprises:
      1. separation means for separating electrical power and communications on each of said plurality of wire pairs;
      2. voltage measuring means for measuring the voltages on each of said plurality of wire pairs;
      3. rectifying means for rectifying the electrical power on each of said plurality of wire pairs into positive and negative voltages;
      4. imposition and measuring means for imposing a controlled voltage on each of said plurality of wire pairs and for measuring the current through each of said plurality of wire pairs for the purpose of detection and classification of the an attached node;
      5. sending means for sending out electrical power onto each of said plurality of wire pairs by an electronic switch; and
      6. current measuring means for measuring electrical current through the port;
b. a first power supplying equipment device that provides both communication and electrical power to the system using industry standard Power over Ethernet, said first power supplying equipment device having a port having a connector for receiving a second end of a first network cable having a first end connected to a first one of the plurality of connection ports in the first chainable Power over Ethernet node; and
c. a second network cable having a first end connected to a second one of the plurality of connection ports in the first chainable Power over Ethernet node, and a second end connected to a second one of the plurality of connection ports in the last chainable Power over Ethernet node.

9. The system for transferring power and communication in a network according to claim 8 further comprising one or more additional Power over Ethernet nodes positioned between said first Power over Ethernet node and said last Power over Ethernet node and connected to other nodes in the group by additional network cables.

10. The system for transferring power and communication in a network according to claim 9, further comprising a second power supplying equipment device that provides both communication and electrical power to the system using industry standard Power over Ethernet, said second power supplying equipment device having a port having a connector for receiving a second end of a second network cable having a first end connected to a first one of the plurality of connection ports in one of the additional Power over Ethernet nodes or the last chainable Power over Ethernet node.

11. The system for transferring power and communication in a network according to claim 10, further comprising a third power supplying equipment device that provides both communication and electrical power to the system using industry standard Power over Ethernet, said third power supplying equipment device having a port having a connector for receiving a second end of a third network cable having a first end connected to a first one of the plurality of connection ports in one of the additional Power over Ethernet nodes, and wherein the first end of the second network cable is connected to said first one of the plurality of connection ports in the last chainable Power over Ethernet node.

12. The system for transferring power and communication in a network according to claim 8, further comprising a second power supplying equipment device that provides both communication and electrical power to the system using industry standard Power over Ethernet, said second power supplying equipment device having a port having a connector for receiving a second end of a second network cable having a first end connected to a first one of the plurality of connection ports in the last chainable Power over Ethernet node.

13. A method for providing power and communication to one or more chained Power over Ethernet nodes in a network of chained nodes comprising the steps of:
  a. performing a detect and classify operation to determine whether a first chained Power over Ethernet node is a powered device, comprising the following steps:
    i. generating detect and classify voltages and classify currents at a power source equipment device;
    ii. transmitting said detect and classify voltages and classify currents over a network cable having a plurality of wire pairs;
    iii. receiving said detect and classify voltages and classify currents at a connection port of the first chained Power over Ethernet node;
    iv. separating electrical power and communications on each of said plurality of wire pairs;
    v. measuring the voltages on each of said plurality of wire pairs;
    vi. rectifying the electrical power on each of said plurality of wire pairs into positive and negative voltages;
    vii. presenting a default detect and classification signature through a powered device circuit in the first chainable Power over Ethernet node;
    viii. transmitting a request from the connection port to the power source equipment device for power sufficient to operate the first chainable Power over Ethernet node based on the default detect and classify signature;
  b. transmitting power from the power source equipment device to the first chainable Power over Ethernet node in an amount corresponding to the request;
  c. performing a reclassification of the first chainable Power over Ethernet node to request additional power from the power source equipment device; and
  d. transmitting power from the power source equipment device to the first chainable Power over Ethernet node in an amount corresponding to the reclassification request.

14. The method of claim 13 wherein the step of performing a detect and classify operation is triggered by connection of the first chainable Power over Ethernet node to the power source equipment device.

15. The method of claim 13 wherein the step of performing a detect and classify operation is triggered by internal powering of the first chainable Power over Ethernet node that is connected to the power source equipment device.

16. The method of claim 13 wherein the reclassification step comprises the steps of:
  a. transmitting through network communications a power level requirement report from the first chainable Power over Ethernet node to the power source equipment device;
  b. determining if the power level requirement report exceeds the amount of power currently provided to the first chainable Power over Ethernet node;
  c. if additional power is needed, transmitting additional power from the power source equipment device to the first chainable Power over Ethernet node;
  d. wherein the power source equipment device and the first chainable Power over Ethernet node exchange network packets to renegotiate the power requirements of the first chainable Power over Ethernet node.

17. The method of claim 13 wherein the reclassification step comprises the steps of:
  a. disabling a regulator of the chainable Power over Ethernet node causing a virtual disconnect of the connection port of the first chained Power over Ethernet node with the power source equipment device using a PD disconnect module;
  b. removing power supplied by the power source equipment device to the first chained Power over Ethernet node, wherein a Power over Ethernet processor in the chainable Power over Ethernet node continues to operate from power supplied by a power storage module in the chainable Power over Ethernet node;
  c. configuring a PD detect and classification module in the chained Power over Ethernet node to a new desired classification;
  d. transmitting power from the power source equipment device to the first chainable Power over Ethernet node in an amount corresponding to the new desired classification.

18. The method of claim 13 further comprising the steps of:
  a. performing a detect and classify operation to determine whether an additional downstream chained Power over Ethernet node is a powered device, comprising the following steps:
    i. generating detect and classify voltages and classify currents at the first chained Power over Ethernet node;
    ii. transmitting said detect and classify voltages and classify currents over a network cable having a plurality of wire pairs;
    iii. receiving said detect and classify voltages and classify currents at a connection port of the additional downstream chained Power over Ethernet node;
    iv. separating electrical power and communications on each of said plurality of wire pairs;
    v. measuring the voltages on each of said plurality of wire pairs;
    vi. rectifying the electrical power on each of said plurality of wire pairs into positive and negative voltages;

vii. presenting a default detect and classification signature through a powered device circuit in the additional chainable Power over Ethernet node;

viii. transmitting a request from the connection port of the additional chainable Power over Ethernet node to the first chainable Power over Ethernet node for power sufficient to operate the additional chainable Power over Ethernet node based on the default detect and classify signature;

b. transmitting power from the first chainable Power over Ethernet node to the additional downstream chainable Power over Ethernet node in an amount corresponding to the request;

c. performing a reclassification of the second downstream chainable Power over Ethernet node to request additional power from the first chainable Power over Ethernet node; and d. transmitting power from the first chainable Power over Ethernet node to the additional chainable Power over Ethernet node in an amount corresponding to the reclassification request.

19. The method of claim 18 further comprising repeating the steps outlined in claim 18 for further additional downstream chainable Power over Ethernet nodes.

* * * * *